(12) United States Patent
McManus et al.

(10) Patent No.: US 8,049,526 B2
(45) Date of Patent: Nov. 1, 2011

(54) ENHANCED SPEED SORTING OF MICROPROCESSORS AT WAFER TEST

(75) Inventors: Moyra Kathleen McManus, Peekskill, NY (US); Hyunjang Nam, Highland Mills, NY (US); Jon Robert Tetzloff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 722 days.

(21) Appl. No.: 12/133,724

(22) Filed: Jun. 5, 2008

(65) Prior Publication Data

US 2009/0306815 A1    Dec. 10, 2009

(51) Int. Cl.
*G01R 31/00* (2006.01)
*G01R 31/02* (2006.01)
*G01R 31/26* (2006.01)

(52) U.S. Cl. ............ 324/759.03; 324/762.05
(58) Field of Classification Search ............... None
See application file for complete search history.

(56) References Cited

U.S. PATENT DOCUMENTS 6,459,293 B1 * 10/2002 Keshavarzi et al. ...... 324/750.03
6,625,758 B1 *  9/2003 Singh ........................... 714/25

* cited by examiner

*Primary Examiner* — Roberto Velez
(74) *Attorney, Agent, or Firm* — Joan Pennington

(57) ABSTRACT

A method and apparatus are provided for implementing optimized speed sorting of microprocessors at wafer test. A combination of speed-predicting metrics are measured early in the manufacturing process and are applied to a unique algorithm to properly sort parts into appropriate speed bins. The method significantly improves the accuracy of predicting the chip speed over conventional speed-predicting methods.

16 Claims, 3 Drawing Sheets

ENHANCED SPEED SORTING OF MICROPROCESSORS AT WAFER TEST

FIELD OF THE INVENTION

The present invention relates generally to the data processing field, and more particularly, relates to a method and apparatus for implementing optimized speed sorting of microprocessors at wafer test.

DESCRIPTION OF THE RELATED ART

Many microprocessor chips are required to function at some published and guaranteed speed or frequency. This frequency can usually be measured at the final, completed configuration of the chip and parts can either be divided into different speed bins or discarded if found not to meet the required frequency.

Manufacturers can save time and money if it was possible to reliably predict the final speed of the chip at test steps well upstream or before the final configuration of the microprocessor chip.

The semiconductor industry uses several different speed-predicting metrics for speed sorting or screening. However, a need exists for an effective method for speed sorting of microprocessors at a wafer level test.

SUMMARY OF THE INVENTION

A principal aspect of the present invention is to provide a method and apparatus for implementing optimized speed sorting of microprocessors at a wafer level test. Other important aspects of the present invention are to provide such method and apparatus for implementing optimized speed sorting of microprocessors at a wafer level test substantially without negative effect and that overcome many of the disadvantages of prior art arrangements.

In brief, a method and apparatus are provided for implementing optimized speed sorting of microprocessors at a wafer level test. A combination of speed-predicting metrics are measured early in the manufacturing process and are applied to a unique algorithm to properly sort parts into appropriate speed bins.

In accordance with features of the invention, a period of a ring oscillator test structure (PSRO) and a quiescent current (IDDQ) are measured on the microprocessor chip at a wafer level test. The measured quiescent current (IDDQ) is compared with a first threshold level, where the first threshold level is a predefined value. When the measured quiescent current is greater than the first threshold level, then the chip is discarded. If not, then the measured quiescent current (IDDQ) is compared with a second threshold level, where the second threshold level is a calculated based upon the measured period of a ring oscillator test structure (PSRO). When the measured quiescent current is greater than the second threshold level, then the chip is discarded. If not then the measured quiescent current is compared with a third threshold level, where the third threshold level is another calculated value based upon the measured period of a ring oscillator test structure (PSRO). When the third threshold level is greater than the measure quiescent current, then the microprocessor chip is assigned to a first bin. Otherwise the microprocessor chip is assigned to a second bin.

In accordance with features of the invention, the method significantly improves the accuracy of predicting the chip speed over conventional speed-predicting methods.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided that implements optimized speed sorting of microprocessors at wafer level test. The method significantly improves the accuracy of predicting the chip speed over conventional speed-predicting methods.

Figure 1:
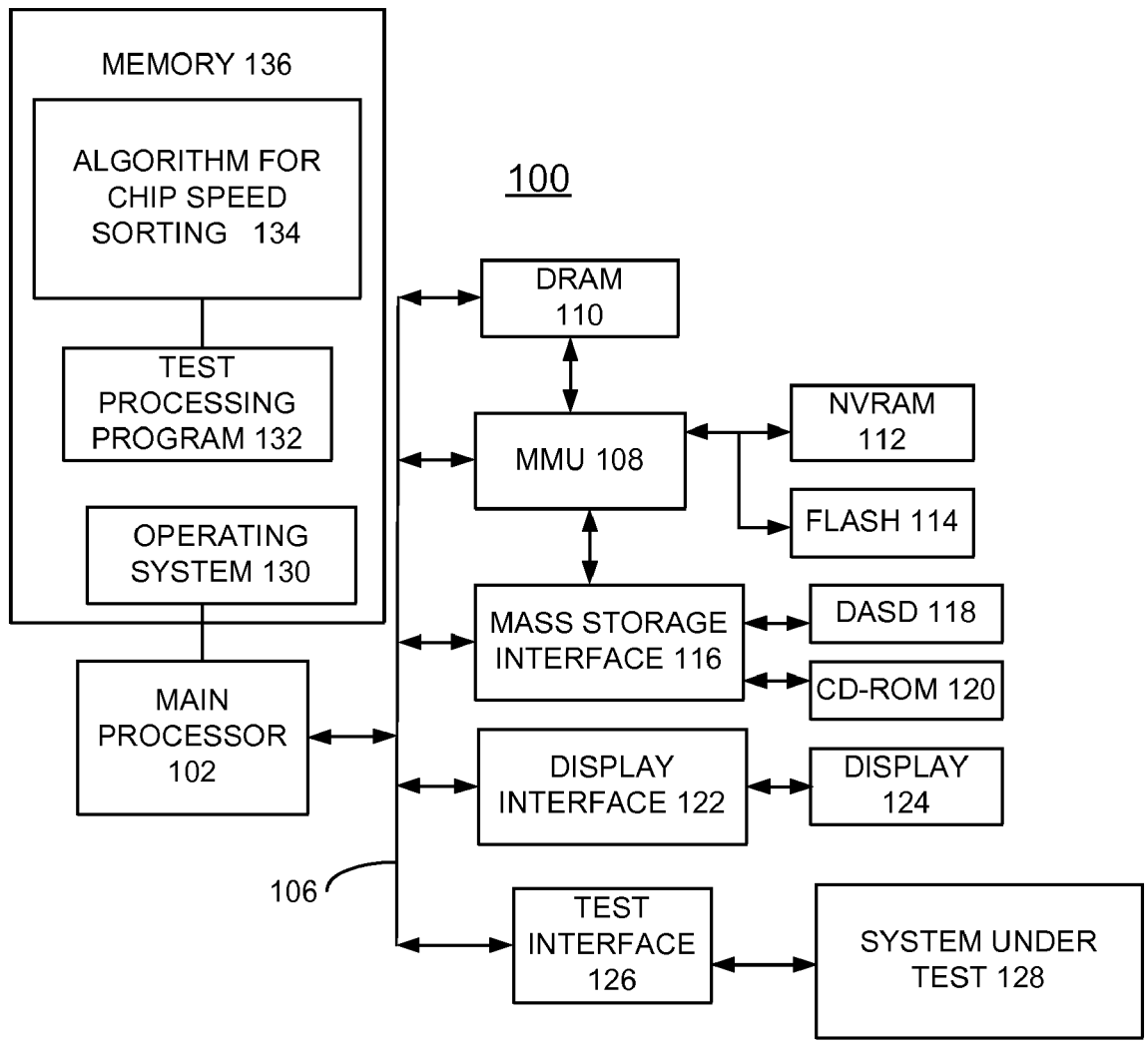
FIG. 1 is a block diagram representations illustrating an exemplary computer test system for implementing optimized speed sorting of microprocessors at wafer level test in accordance with the preferred embodiment.

Referring now to the drawings, in FIG. 1 there is shown an exemplary computer test system generally designated by the reference character 100 for implementing optimized speed sorting of microprocessors at wafer test in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102.

Computer system 100 includes a display interface 122 connected to a display 124, and a test interface 126 coupled to the system bus 106. A system under test 128 is coupled to the test interface 126.

Testing in accordance with the preferred embodiment advantageously is preformed early in the manufacturing process. The system under test 128 includes, for example, a microprocessor chip at a wafer test level.

Computer system 100 includes an operating system 130, a test processing program 132 of the preferred embodiment, and a chip speed sorting algorithm 134 of the preferred embodiment resident in a memory 136.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2:
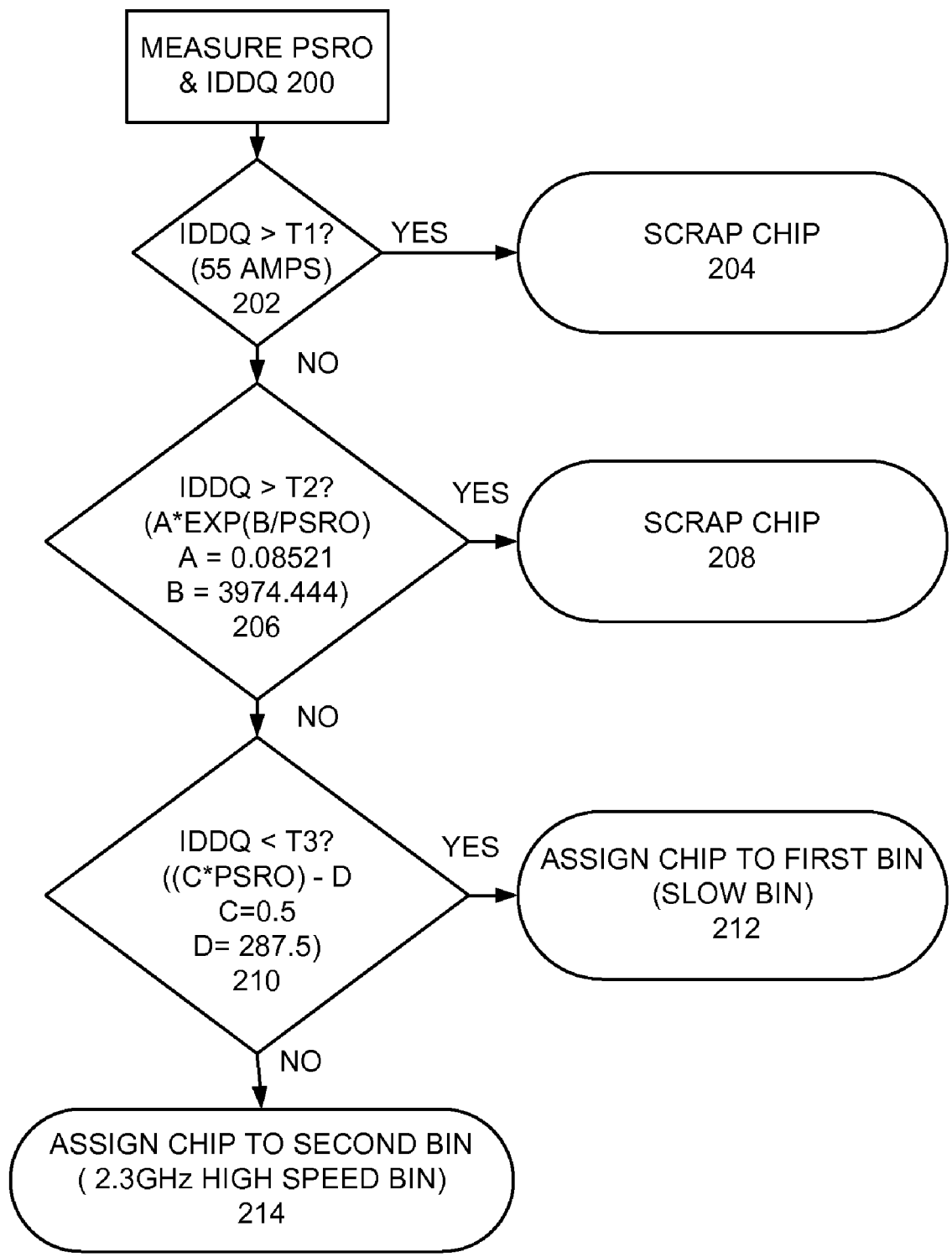
FIG. 2 is a flow chart illustrating exemplary steps for implementing optimized speed sorting of microprocessors at wafer level test in accordance with the preferred embodiment.

Referring now to FIG. 2, there are shown exemplary steps for implementing optimized speed sorting of microprocessors at wafer test in accordance with the preferred embodiment starting at a block 200 with measuring a period of a ring oscillator test structure (PSRO) and a quiescent current (IDDQ) are measured on the microprocessor chip at wafer level test. The measured quiescent current (IDDQ) is compared with a first threshold level T1, where the first threshold level is a predefined value as indicated at a decision block 202. For example, the first threshold level is a maximum value for quiescent current (IDDQ), such as 55 Amps for one particular microprocessor chip 128. When the measured quiescent current is greater than the first threshold level, then the chip is discarded as indicated at a block 204. If not, then the measured quiescent current (IDDQ) is compared with a second threshold level as indicated at a decision block 206. The second threshold level is a calculated based upon the measured period of a ring oscillator test structure (PSRO). For example, the second threshold level T2 is represented by $$T2 = A * \exp(B/PSRO)$$

with A=0.08521 and B=3974.444

When the measured quiescent current is greater than the second threshold level, then the chip is discarded as indicated at a block 208. If not then the measured quiescent current is compared with a third threshold level T3, where the third threshold level is another calculated value based upon the measured period of a ring oscillator test structure (PSRO). For example, the second threshold level T3 is represented by $$T3 = (C * PSRO) - D$$

with C=0.5 and D=287.5

When the third threshold level is greater than the measure quiescent current, then the microprocessor chip is assigned to a first bin, such a slow bin, as indicated at a block 212. Otherwise the microprocessor chip is assigned to a second bin as indicated at a block 214, such as a high speed bin for 2.3 GHz operation of the microprocessor chip 128.

Figure 3:
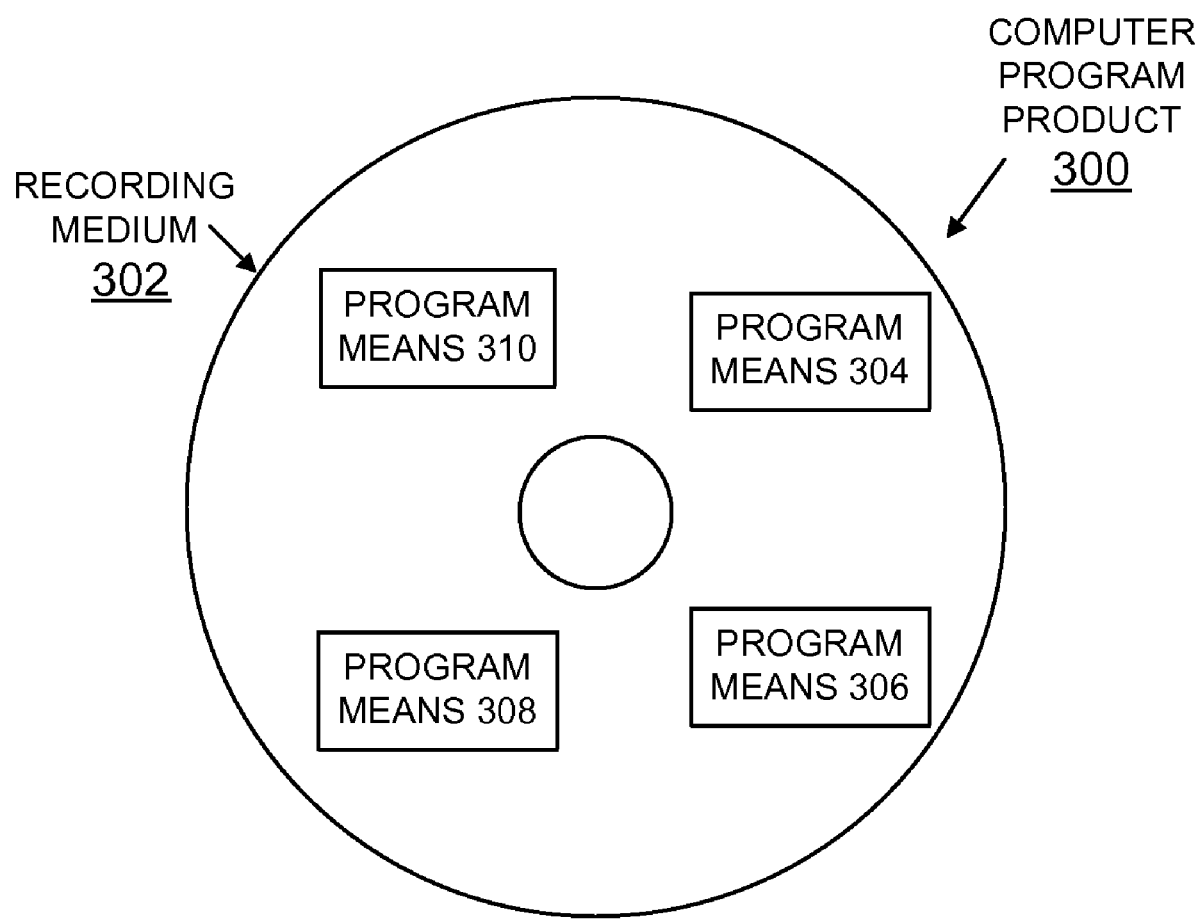
FIG. 3 is a block diagram illustrating a computer program product in accordance with the preferred embodiment.

Referring now to FIG. 3, an article of manufacture or a computer program product 300 of the invention is illustrated. The computer program product 300 includes a recording medium 302, such as, a floppy disk, a high capacity read only memory in the form of an optically read compact disk or CD-ROM, a tape, or another similar computer program product. Recording medium 302 stores program means or instructions 304, 306, 308, 310 on the medium 302 for carrying out the methods for implementing optimized speed sorting of microprocessors at wafer test of the preferred embodiment in the system 100 of FIG. 1.

A sequence of program instructions or a logical assembly of one or more interrelated modules defined by the recorded program means 304, 306, 308, 310, direct the computer system 100 for implementing optimized speed sorting of microprocessors at wafer test of the preferred embodiment.

While the present invention has been described with reference to the details of the embodiments of the invention shown in the drawing, these details are not intended to limit the scope of the invention as claimed in the appended claims.

What is claimed is:

1. A method for implementing optimized speed sorting of microprocessors at a wafer level test comprising:

measuring a combination of speed-predicting metrics for the microprocessors at the wafer level test in the manufacturing process of the microprocessors including measuring a quiescent current (IDDQ) for the microprocessors at the wafer level test and measuring a period of a ring oscillator test structure (PSRO) for the microprocessors at the wafer level test; and using said measured combination of speed-predicting metrics to identify defective microprocessors, and to sort microprocessors into predefined speed bins including comparing the measured quiescent current (IDDQ) with a second threshold level; and said second threshold level is a calculated value based upon the measured period of a ring oscillator test structure (PSRO) for the microprocessors at the wafer level test.

2. The method for implementing optimized speed sorting of microprocessors at a wafer level test as recited in claim 1 wherein using said measured combination of speed-predicting metrics to identify defective microprocessors, and to sort microprocessors into predefined speed bins includes comparing the measured quiescent current (IDDQ) with a first threshold level; and said first threshold level is a predefined value.

3. The method for implementing optimized speed sorting of microprocessors at a wafer level test as recited in claim 2 wherein using said measured combination of speed-predicting metrics to identify defective microprocessors, and to sort microprocessors into predefined speed bins further includes identifying a defective microprocessor responsive to the measured quiescent current (IDDQ) being greater than said first threshold level.

4. The method for implementing optimized speed sorting of microprocessors at a wafer level test as recited in claim 1 wherein using said measured combination of speed-predicting metrics to identify defective microprocessors, and to sort microprocessors into predefined speed bins further includes identifying a defective microprocessor responsive to the measured quiescent current (IDDQ) being greater than the second threshold level.

5. The method for implementing optimized speed sorting of microprocessors at a wafer level test as recited in claim 1 wherein using said measured combination of speed-predicting metrics to identify defective microprocessors, and to sort microprocessors into predefined speed bins includes comparing the measured quiescent current (IDDQ) with a third threshold level; and said third threshold level is another calculated value based upon the measured period of a ring oscillator test structure (PSRO) for the microprocessors at the wafer level test.

6. The method for implementing optimized speed sorting of microprocessors at a wafer level test as recited in claim 5 wherein using said measured combination of speed-predicting metrics to identify defective microprocessors, and to sort microprocessors into predefined speed bins includes assigning the microprocessor to a first bin responsive to the measured quiescent current (IDDQ) being less than the third threshold level.

7. The method for implementing optimized speed sorting of microprocessors at a wafer level test as recited in claim 6 wherein using said measured combination of speed-predicting metrics to identify defective microprocessors, and to sort microprocessors into predefined speed bins includes defining the first bin is a predefined slow speed bin.

8. The method for implementing optimized speed sorting of microprocessors at a wafer level test as recited in claim 5 wherein using said measured combination of speed-predicting metrics to identify defective microprocessors, and to sort microprocessors into predefined speed bins includes assigning the microprocessor to a second bin responsive to the measured quiescent current (IDDQ) greater than or equal to the third threshold level.

9. The method for implementing optimized speed sorting of microprocessors at a wafer level test as recited in claim 8 wherein using said measured combination of speed-predicting metrics to identify defective microprocessors, and to sort microprocessors into predefined speed bins includes defining the second bin is a predefined high speed bin.

10. An apparatus for implementing optimized speed sorting of microprocessors at a wafer level test comprising:

a test processing program embodied in a non-transitory machine readable storage medium measuring the combination of speed-predicting metrics for the microprocessors at the wafer level test in the manufacturing process of the microprocessors including measuring a period of a ring oscillator test structure (PSRO) and a quiescent current (IDDQ) on the microprocessor chip at wafer level test; and said test processing program including a speed sorting algorithm using said measured combination of speed-predicting metrics to identify defective microprocessors, and to sort microprocessors into predefined speed bins.

11. The apparatus for implementing optimized speed sorting of microprocessors at a wafer level test as recited in claim 10 wherein said test processing program including said speed sorting algorithm compares said measured quiescent current (IDDQ) with a first threshold level, and said first threshold level is a predefined maximum current value.

12. The apparatus for implementing optimized speed sorting of microprocessors at a wafer level test as recited in claim 11 wherein said test processing program including said speed sorting algorithm identifies a defective microprocessor responsive to said measured quiescent current (IDDQ) being greater than said first threshold level.

13. The apparatus for implementing optimized speed sorting of microprocessors at a wafer level test as recited in claim 11 wherein said test processing program including said speed sorting algorithm compares said measured quiescent current (IDDQ) with a second threshold level, and said second threshold level is a calculated value based upon the measured period of a ring oscillator test structure (PSRO) for the microprocessors at the wafer level test.

14. The apparatus for implementing optimized speed sorting of microprocessors at a wafer level test as recited in claim 13 wherein said test processing program including said speed sorting algorithm identifies a defective microprocessor responsive to said measured quiescent current (IDDQ) being greater than said second threshold level.

15. The apparatus for implementing optimized speed sorting of microprocessors at a wafer level test as recited in claim 13 wherein said test processing program including said speed sorting algorithm compares said measured quiescent current (IDDQ) with a third threshold level, and said third threshold level is a different calculated value based upon the measured period of a ring oscillator test structure (PSRO) for the microprocessors at the wafer level test.

16. The apparatus for implementing optimized speed sorting of microprocessors at a wafer level test as recited in claim 15 wherein said test processing program including said speed sorting algorithm assigns the microprocessor to a predefined fast speed bin responsive to said measured quiescent current (IDDQ) being greater than or equal to said third threshold level; and assigns the microprocessor to a predefined slow speed bin responsive to said measured quiescent current (IDDQ) being less than said third threshold level.

* * * * *